United States Patent
Noda et al.

(10) Patent No.: US 7,400,034 B2
(45) Date of Patent: Jul. 15, 2008

(54) SEMICONDUCTOR DEVICE

(75) Inventors: Kouichirou Noda, Fukuoka (JP); Shigenobu Kato, Akiruno (JP); Goro Kitsukawa, Hinode-machi (JP); Michihiro Mishima, Kunitachi (JP)

(73) Assignee: Elpida Memory, Inc., Tokyo (JP)

( * ) Notice: Subject to any disclaimer, the term of this patent is extended or adjusted under 35 U.S.C. 154(b) by 524 days.

(21) Appl. No.: 11/196,267

(22) Filed: Aug. 4, 2005

(65) Prior Publication Data

US 2005/0263811 A1 Dec. 1, 2005

Related U.S. Application Data

(63) Continuation of application No. 10/330,054, filed on Dec. 30, 2002, now abandoned, which is a continuation of application No. 09/310,580, filed on May 12, 1999, now abandoned.

(30) Foreign Application Priority Data

May 12, 1998 (JP) ............................. 10-128797

(51) Int. Cl.
*H01L 23/52* (2006.01)
(52) U.S. Cl. .................. 257/691; 365/189.02
(58) Field of Classification Search ............... 257/315, 257/691, 907–908, E21.409; 365/189.02, 365/51
See application file for complete search history.

(56) References Cited

U.S. PATENT DOCUMENTS

| 5,262,999 | A | 11/1993 | Etoh et al. |
|---|---|---|---|
| 5,473,198 | A | 12/1995 | Hagiya et al. |
| 5,537,351 | A | 7/1996 | Suwa et al. |
| 5,567,655 | A | 10/1996 | Rostoker et al. |
| 5,579,256 | A | 11/1996 | Kajigaya et al. |
| 5,619,472 | A | 4/1997 | Okamura |
| 5,627,792 | A | 5/1997 | Tsujimoto |
| 5,640,362 | A | 6/1997 | Yoo |
| 5,661,686 | A | 8/1997 | Gotou |
| 6,373,776 | B2 * | 4/2002 | Fujisawa et al. ........ 365/230.03 |
| 6,384,449 | B2 * | 5/2002 | Lee et al. ..................... 257/315 |
| 2008/0048241 | A1 * | 2/2008 | Fujiwara et al. ............. 257/315 |

FOREIGN PATENT DOCUMENTS

JP 3-116865 5/1991

* cited by examiner

*Primary Examiner*—Nathan W Ha
(74) *Attorney, Agent, or Firm*—Antonelli, Terry, Stout & Kraus, LLP.

(57) ABSTRACT

There is provided a large capacity memory such as a DRAM and an SDRAM n which bonding pads PS and PD are not located at the center, but are displaced from the center between memory array regions UL and UR, disposed on the upper side of a four-bank structure of banks 0 through 3, and memory array regions DL and DR, disposed on the lower side thereof. Secondly, the disposition of the bonding pads PS and PD is staggered on the right and left such that the right half bonding pads PD are shifted up relative to the left half bonding pads by about 30 μm. Only a sense amplifier, a column decoder and a main amplifier, which need to be near to the memory array regions DL and DR, are disposed between the bonding pads PS and PD, and the lower memory array regions DL and DR, and further indirect peripheral circuits are disposed on the upper side of the bonding pads PS and PD.

18 Claims, 8 Drawing Sheets

SEMICONDUCTOR DEVICE

This is a Continuation of U.S. application Ser. No. 10/330,054, filed Dec. 30, 2002; which, now abandoned in turn, is a continuation of U.S. application Ser. No. 09/310,580, filed May 12, 1999 (now abandoned), the entire disclosure of which is incorporated herein by reference.

BACKGROUND OF THE INVENTION

The present invention relates to a technology for laying out semiconductor devices and more specifically to a technology effectively applicable to the disposition of pads for efficiently laying out a large capacity memory, such as a DRAM and a synchronous DRAM (SDRAM).

The technological problem in DRAMs and SDRAMs which the inventor has examined is that the number of bits tends to be multiplied from ×4 to ×16 and ×32 and the number of pads tends to be also increased. For instance, while the number of input/output pins in a 64 M-bit DRAM (×4, ×8 and ×16 have been realized by a bonding option) is 54 in the package, the DRAM requires about 70 pads as internal pads, including normal signal pads, such as address, clock and data signal pads, power source pads, experimental pads and bonding option pads (for switching ×4 through ×16 and for switching the number of banks). It also requires predetermined pad dimensions and spaces therebetween, and it has become difficult to array the pads in a row for the LOC method gradually in the shrink generation. Even if they can be arrayed in a row, it has become difficult to assure large channel and power source bus regions between them in their gap.

A step-down system or a voltage regulator is often adopted in recent high-integrated memories, so that a variety of power source lines are required within a chip.

They include VDD, VSS, VDDQ and VSSQ lines as the external power source lines, and VPERI (for a peripheral circuit), VDL (for a memory array), VPP (for a boost word driver) and VBB (for biasing an array substrate) lines as the internal power source lines. Still more, the power source lines may be divided into those for the memory arrays (VDDA, VSSA), those for the general peripheral circuits (VDD, VSS) and those for the input circuits (VDDI, VSSI) as measures to counter noises. Thus, it has become difficult to dispose the pads adequately due to the increase in the number of the pads owing to the multiplication of bits and the variety of power source lines which have come to be required due to the high integration in memories, such as the DRAM and SDRAM.

It is noted that an example of the technology related to large capacity memories, such as the DRAM and SDRAM, is described in "Advanced Electronics 1-9, Super LSI Memory" published by Baifukan Co., Ltd. on Nov. 5, 1994.

Japanese Patent Laid-open No. 116865/1991 has disclosed a semiconductor memory device in which direct peripheral circuits are disposed in a region between two memory cell arrays along the respective memory cell arrays, in-direct peripheral circuits are disposed in a region between the direct peripheral circuits along one direct peripheral circuit, external terminals are disposed in the region between the direct peripheral circuits along the other direct peripheral circuit and a substrate voltage generating circuit is disposed in a region between the indirect peripheral circuit and the external terminal.

U.S. Pat. No. 5,579,256 (corresponding to Japanese Patent Laid-Open No. 134568/1998) has disclosed a semiconductor device in which bonding pads, a voltage converter, a substrate voltage generating circuit and others are disposed at the center part of the chip.

U.S. Pat. No. 5,473,198 (corresponding to Japanese Patent Laid-open No. 350052/1994) has disclosed a semiconductor device in which axially symmetrical data input/output pads are disposed in two rows in parallel at the center part of the semiconductor chip.

U.S. Pat. No. 5,640,362 (corresponding to Japanese Patent Laid-open No. 128973/1997) has disclosed a synchronous semiconductor memory device having a plurality of data input/output pad groups 20 positioned at the right and left sides based on the center of a semiconductor chip 100, disposed in a row horizontally between upper and lower memory bank arrays 0 through 7 and having the same number with the memory array banks 0 through 7 to input/output information to/from the memory array banks 0 through 7.

U.S. Pat. No. 5,619,472 (corresponding to Japanese Patent Laid-Open No. 139287/1996) has disclosed a center pad disposed type semiconductor memory device in which an IO pad array, i.e., a first pad array, is disposed between a core block 1 and a core block 2 and an address pad array, i.e., a second pad array, is disposed between a core block 3 and a core block 4.

U.S. Pat. No. 5,627,792 (corresponding to Japanese Patent Laid-Open No. 125143/1996) has disclosed a semiconductor memory device in which respective pins (power source pins, ground pins, data input/output pins, control system signal pins, address system signal pins) of a lead frame are connected to bonding pad groups disposed along a center line in the center part of a semiconductor substrate by bonding wires 55.

SUMMARY OF THE INVENTION

In consideration of the regularity of the disposition of standard pins in a large capacity memory, such as the DRAM and SDRAM as described above, the inventor has examined an efficient layout of the pads and the so-called indirect peripheral circuits (except for the direct peripheral circuits, such as memory cells, sense amplifiers and decoders) conforming to that. The subject matter which the inventor has examined will be explained below with reference to FIGS. 8 and 9.

Figure 8:
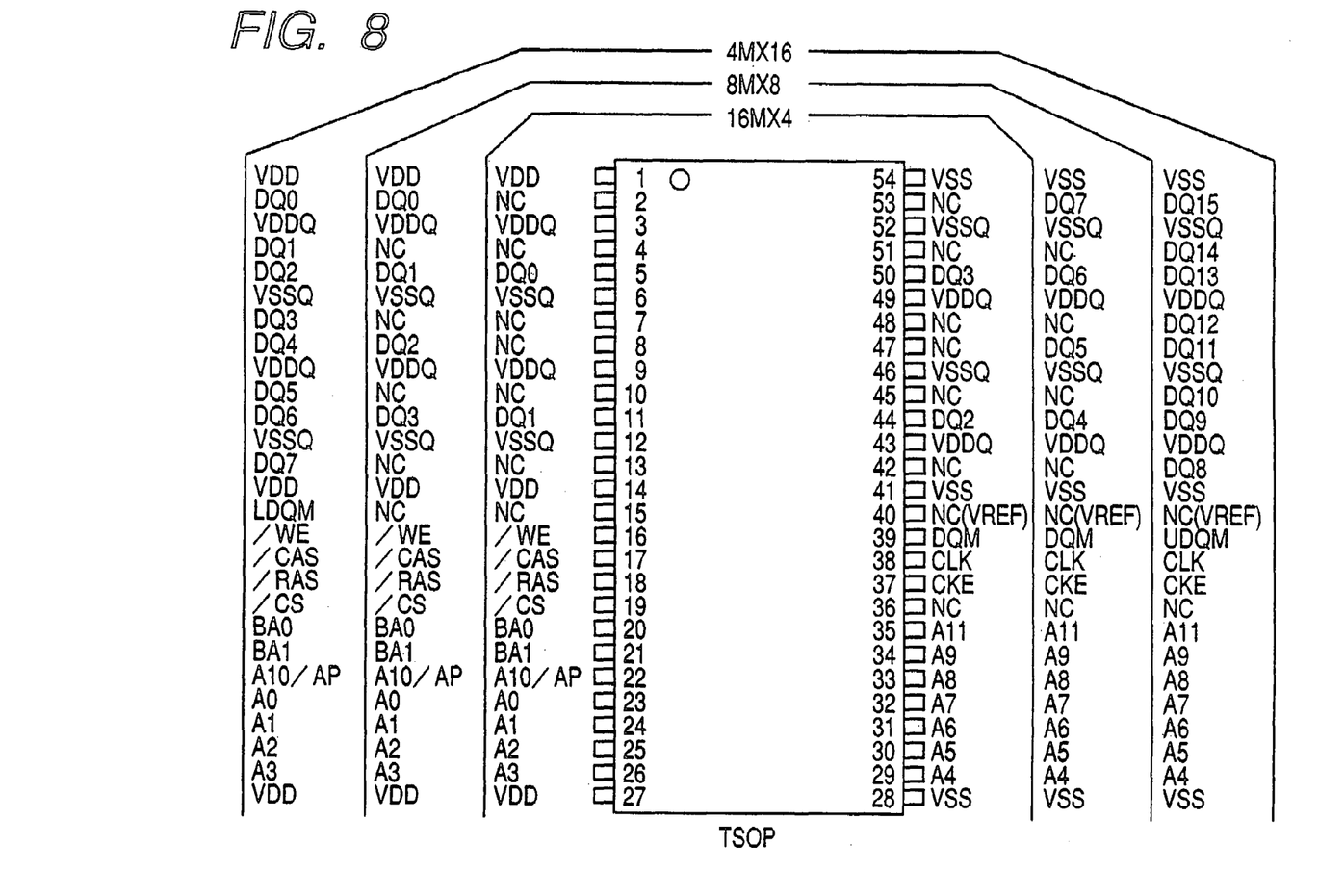
FIG. 8 is a diagram for explaining the disposition of input/output pins in a semiconductor memory device which is a precondition of the invention.

The disposition of the standard pins of the DRAM and SDRAM will be considered at first. FIG. 8 shows the disposition of the pins of a 64 M SDRAM. As shown in the figure, data signal pins (DQ*) exist at the upper half of the chip in the figure and address and clock signal system pins (A*, CLK, CKE, /RAS, /CAS etc.) exist at the lower half. This general arrangement is the same also in an EDO DRAM other than the SDRAN. Considering this arrangement by turning the chip clockwise through 90 degrees, it is seen from the point of view of design of the chip that the data signal system circuits exist at the right half of the chip and the address and clock signal system circuits exist at the left half thereof. Thus, concentrating on the characteristics of the bonding pad groups and circuit groups whose properties are different, the inventor has considered a way of disposing them efficiently.

Figure 9:
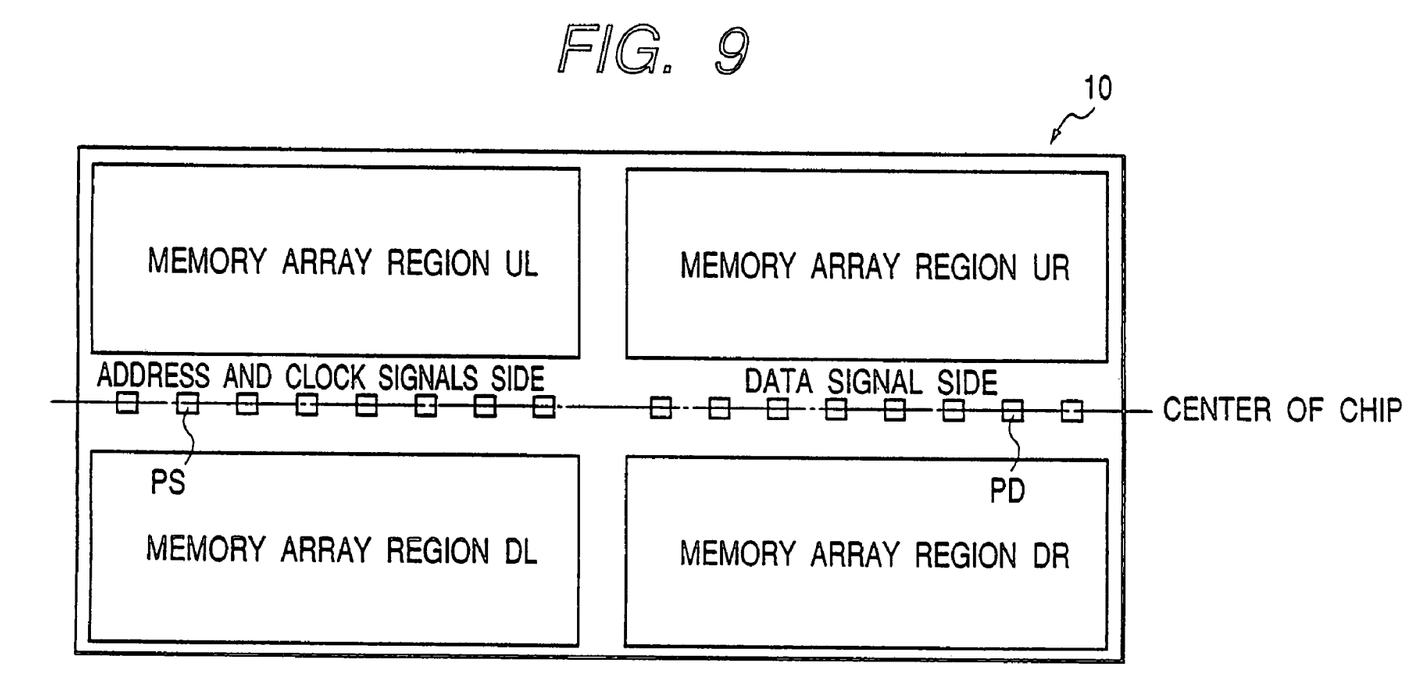
FIG. 9 is a schematic layout showing the disposition of bonding pads in the semiconductor memory device which is in accordance with the precondition of the invention.

FIG. 9 shows the disposition of the conventional LOC assembling pads. The bonding pads PS and PD are disposed almost at the center of the indirect peripheral circuit region, electrostatic protecting elements and input/output circuits are disposed in the vicinity of the bonding pads PS and PD and internal circuits such as a control circuit and a pre-decoder are disposed between the regions at both the upper and the lower sides of the bonding pads PS and PD and the memory array regions UL, UR, DL and DR. Because the internal circuit groups are divided vertically by the bonding pads PS and PD in this arrangement, it becomes difficult to exchange a large number of signals. Still more, there might be a problem in that, when the circuit blocks are divided into upper and lower parts, a power source line region is wasted because two sets of power source bus lines are required.

It is an object of the present invention to provide a semiconductor device in the form of a large capacity memory such as a DRAM and SDRAM which allows an efficient layout of bonding pads and indirect peripheral circuits to be realized by taking into consideration the wiring and size of electrostatic protecting elements and input/output circuits disposed in the vicinity of the bonding pads and of the internal circuits disposed between the upper and lower regions of the bonding pads and the memory array regions.

The above and other objects as well as the novel characteristics of the invention will be apparent from the description provided in the present specification and from the accompanying drawings.

The typical features of the invention disclosed in the present application may be summarized as follows.

According to a first feature of the inventive semiconductor device, bonding pad groups are not located at the center, but are displaced to the upper or lower side of center between memory the array regions in arranging the pads in a large capacity memory such as a DRAM and an SDRAM having a large number of bonding pads. Secondly, the disposition of the bonding pads is staggered on the right and left, such that the right bonding pads on the data signal side are disposed closer to the center more or less.

Because the indirect peripheral circuits are disposed collectively on the other side in the semiconductor device described above according to the first feature, it allows a number of signals to be exchanged between the upper and lower sides by causing the gap with the bonding pads to be reduced. It also requires only one set of power source buses for the indirect peripheral circuits.

The second feature allows a large number of signal channels to be assured on the address and clock signal side. Although the data signal side requires not so many signal channels as compared to the address and clock signal side, large output transistors may be suitably placed adjoining the bonding pad thereabove and therebelow. While special power sources such as power sources dedicated for the output transistors are necessary on the data signal side additionally, they may be also suitably placed.

As a result, the indirect peripheral circuits may be laid out efficiently on the chip as a whole and the improvement of the speed may be achieved by the reduction of the chip area and the shortening of the signal passages.

A semiconductor device of the invention has a first edge (10-1) extending in a first direction; a second edge (10-2) parallel to the first edge; a third edge (10-3) extending in a second direction perpendicular to the first edge; and a fourth edge (10-4) parallel to the third edge; and further comprises an output circuit (22, 23); a first memory array (UR) disposed between the first edge and a first imaginary line (10-5); and a second memory array (DR) disposed between the second edge and the first imaginary line. In the semiconductor device, the plurality of pads (PD) are disposed on a second imaginary line (10-6); the first imaginary line is an imaginary line connecting a middle point (10-8) of the third edge and a middle point (10-9) of the fourth edge; and the second imaginary line is an imaginary line which is parallel with the first imaginary line and which is disposed between the first imaginary line and the second edge. The plurality of pads contain a first pad; the output circuit is connected with the first pad; the output circuit contains a first transistor (22) of a first conductivity type and a second transistor (23) of a second conductivity type; the first conductivity type is different from the second conductivity type; the first transistor is disposed between the first imaginary line and the first memory array; and the second transistor is disposed between the second imaginary line and the second memory array.

The above configuration allows a layout area for disposing the peripheral circuits to be largely prepared and an area occupied by the output circuits to be reduced. For instance, when the first and second transistors of the output circuit are PMOS and NMOS transistors, at least a part of a separating region for separating the PMOS and NMOS transistors may be created by utilizing the lower part of the first pad connected to the output circuit. This then allows the area occupied by the output circuits to be reduced.

Another semiconductor device of the invention has a first edge extending in a first direction; a second edge parallel to the first edge; a third edge extending in a second direction perpendicular to the first edge; and a fourth edge parallel to the third edge; and further comprises a plurality of first pads (PD) to which data signals are supplied; a plurality of second pads-(PS) to which address signals are supplied; a first memory array disposed between the first edge and a first imaginary line; and a second memory array disposed between the second edge and the first imaginary line. In the semiconductor device, the plurality of first pads are disposed on a second imaginary line; the plurality of second pads are disposed on a third imaginary line (10-7); the first imaginary line is an imaginary line connecting a middle point of the third edge and a middle point of the fourth edge; the second imaginary line is an imaginary line which is parallel with the first imaginary line and which is disposed between the first imaginary line and the second edge; and the third imaginary line is an imaginary line which is parallel with the first imaginary line and disposed between the second imaginary line and the second edge.

The above configuration allows the space for disposing the peripheral circuits such as an address buffer, an address decoder, data input/output circuits for inputting/outputting data signals and various voltage generating circuits to be prepared collectively and an area occupied by the circuits for outputting the data signals to be reduced. It also allows a large number of address signal lines to be disposed collectively.

A still other semiconductor device of the invention has a first edge extending in a first direction; a second edge parallel to the first edge; a third edge extending in a second direction perpendicular to the first edge; and a fourth edge parallel to the third edge; and further comprises a plurality of first pads; a plurality of second pads; a first memory array disposed between the first edge and a first imaginary line; and a second memory array disposed between the second edge and the first imaginary line. In the semiconductor device, the plurality of first pads are disposed on a second imaginary line; the plurality of second pads are disposed on a third imaginary line; the first imaginary line is an imaginary line connecting a middle point of the third edge and a middle point of the fourth edge; the second imaginary line is an imaginary line which is parallel with the first imaginary line and which is disposed between the first imaginary line and the second edge; the third imaginary line is an imaginary line which is parallel with the first imaginary line and disposed between the second imaginary line and the second edge; no pad exists between the plurality of first pads and the second edge; and no pad exists between the plurality of second pads and the first edge.

The above configuration allows the space for disposing the peripheral circuits such as an address buffer and an address decoder which receive address signals, data input/output circuits for inputting/outputting data signals and various voltage generating circuits to be prepared collectively and an area occupied by the circuits for outputting the data signals to be reduced. It also allows a large number of address signal lines to be disposed collectively. Further, because no pad exists between the plurality of first pads and the second edge and between the plurality of second pads and the first edge, many circuits may be disposed in this region and wires to be drawn around may be reduced.

BRIEF DESCRIPTION OF THE DRAWINGS

FIGS. I(a) and I(b) are a schematic layout diagram and a partially enlarged view thereof, respectively, showing a semiconductor memory device according to one embodiment of the invention.

DETAILED DESCRIPTION OF THE INVENTION

An embodiment of the present invention will be explained in detail based on the drawings. It is noted that the same reference numerals denote the same members throughout the drawings for explaining the embodiment and their repeated explanation will be omitted.

Figures 1A, 1B:
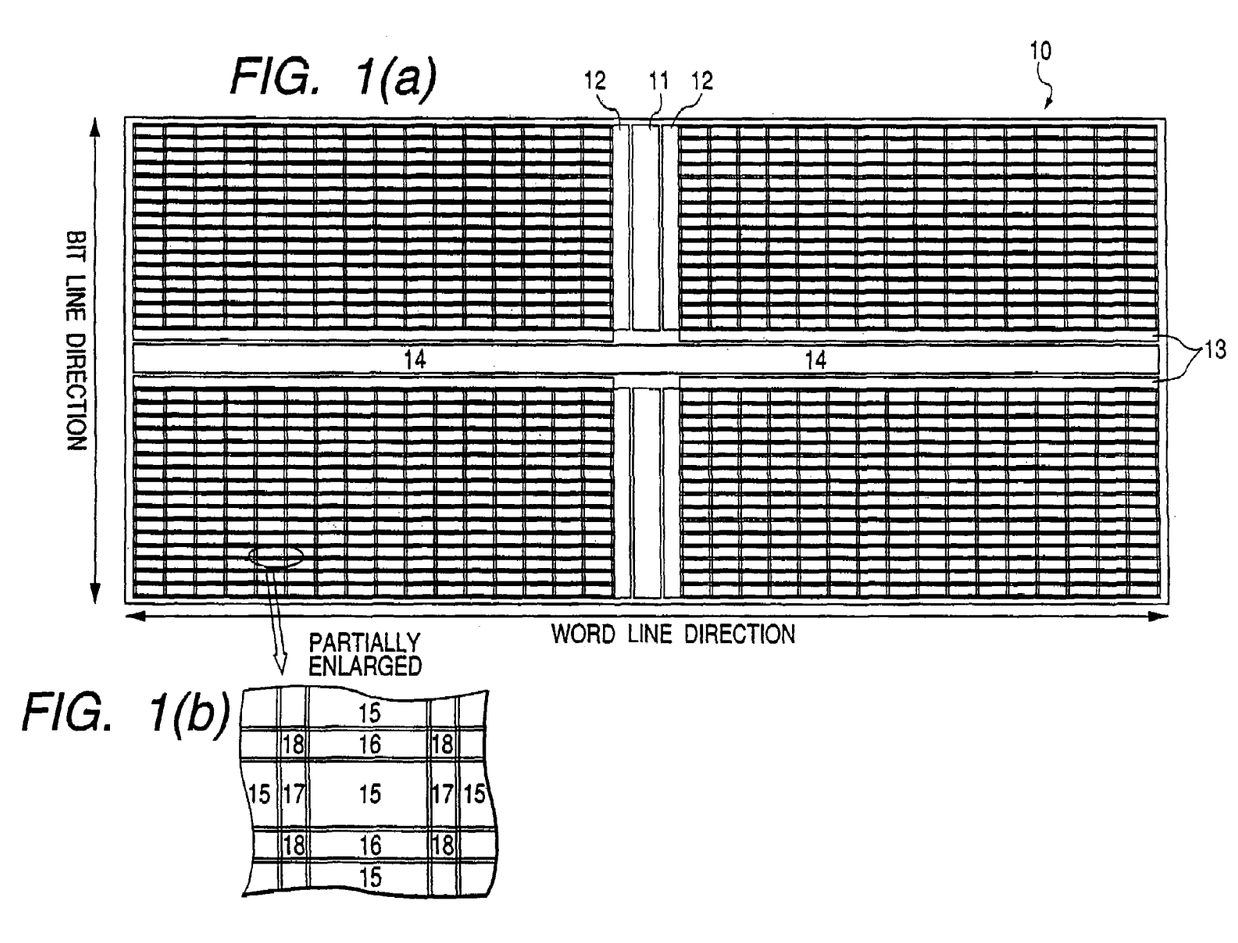

The structural layout of the semiconductor memory device of the present embodiment will be explained with reference to FIGS. Ia and Ib at first.

The semiconductor memory device of the present embodiment is formed as a large capacity memory, such as a DRAM or an SDRAM. Formed on one semiconductor chip 10 by a known semiconductor manufacturing technique are main row decoder regions 11, main word driver regions 12, column decoder regions 13, peripheral circuit and bonding pad regions 14, memory cell arrays 15, sense amplifier regions 16, sub-word driver regions 17, and intersection regions 18. In FIG. 1, the horizontal direction is the line direction (word line direction) and the vertical direction is the column direction (bit line direction).

In the large capacity memory, memory array regions composed of the memory cell arrays 15 and other elements are disposed so as to be divided into four banks 0 through 3 on the right and left side in the line direction and on the upper and lower sides in the column direction of the memory chip 10 as shown in FIG. 1 for example. The memory array regions disposed on the right and left sides each are disposed as a pair, while the main row decoder region 11 is disposed at the center via the main word driver regions 12.

The column decoder regions 13 corresponding to the memory array regions disposed at the upper and lower sides of the memory chip 10 are disposed at the center sides of the respective memory array regions. Row address buffers, column address buffers, pre-decoders, a timing generating circuit, data input/output circuits and other elements are disposed and bonding pads for connecting to the outside are provided further at the center thereof as the peripheral circuit and bonding pad regions 14.

In the memory array region, the sense amplifier regions 16 are disposed in the column direction of the memory cell arrays 15 while adjoining the memory cell array, the sub-word driver regions 17 are disposed in the line direction thereof while adjoining them, and an FX driver (for driving the sub-word driver) and a control circuit of the sense amplifier group (such as a switching MOS transistor) are disposed in the intersection region 18 of the sense amplifier region 16 and the sub-word driver region 17. The word line is set in the line direction and the bit line is set in the column direction with respect to this memory cell array 15. It is apparent that the invention is applicable also when this disposition is reversed.

In the large capacity memory according to the invention, the disposition of the bonding pads provided in the peripheral circuit and bonding pad regions 14 at the center of the memory array regions disposed at the upper and lower sides thereof is inventive. This will be explained below with reference to FIGS. 2 through 7.

Figure 2:
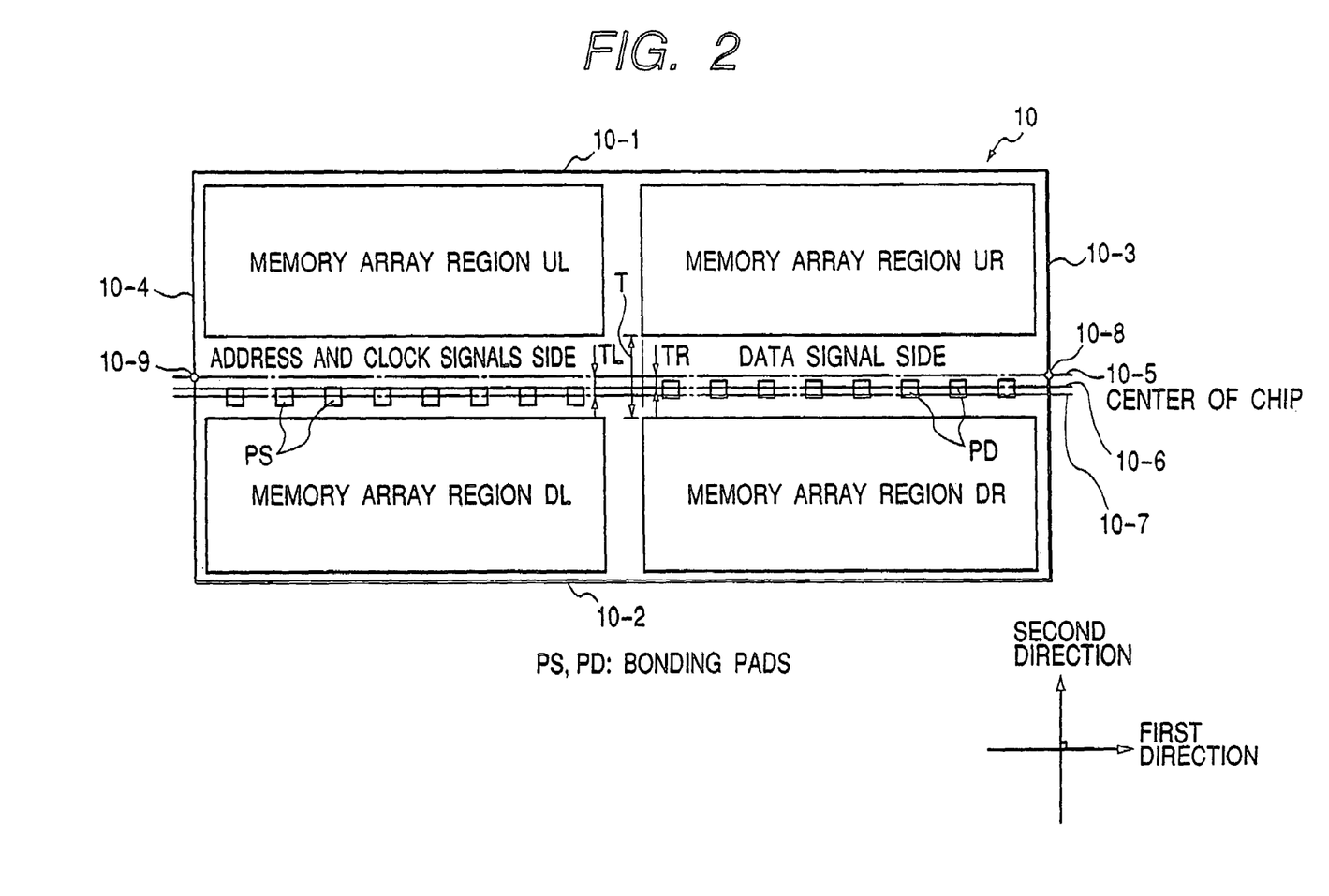
FIG. 2 is a schematic layout diagram showing the disposition of bonding pads in the semiconductor memory device of the embodiment.

FIG. 2 is a diagram showing the disposition of the bonding pads. In contrast to the one shown in FIG. 9, this arrangement has two characteristic points. Firstly, the bonding pads PS and PD are not disposed at the center, but are shifted off the centerline between the memory array regions UL and UR disposed on the upper side of the four banks of the banks 0 through 3 and the memory array regions DL and DR disposed on the lower side. They are shifted to the lower side in FIG. 2. Secondly, the disposition of the bonding pads PS and PD are staggered on the right side relative to the left side. That is, the right-half bonding pads PD are shifted up relative to the bonding pads PS. The relative shift is around 30 μm. only the sense amplifier, the column decoder and the main amplifier which need to be near to the memory array regions DL and DR are disposed between the bonding pads PS and PD and the lower memory array regions DL and DR and the so-called indirect peripheral circuits are placed on the upper side of the bonding pads PS and PD.

Because the indirect peripheral circuits are disposed collectively on the upper side by shifting the bonding pads PS and PD towards the lower side as a whole according to the first characteristic point, the number of signals exchanged on the upper and lower sides of the bonding pads PS and PD is reduced remarkably as compared to the case of FIG. 9. Further, it is necessary to provide only one set of power source buses which are necessary for the indirect peripheral circuits on the upper side. Although power sources for the column decoder and the main amplifier are necessary also on the lower side as a matter of course, they may be omitted because a large number of power sources are unnecessary on the lower side.

A large number of signal channels accompanying the X and Y address signal system and the control circuit may be assured in the indirect peripheral circuits on the left side by relatively disposing the right bonding pads PD toward the upper side more or less. While the input/output circuits which handle data mostly occupy the right side and require less signal channels as compared to the left side, it is preferable to shift the bonding pads PD to the upper side to place the large output transistors so as to be adjoining above and below the bonding pads PD. Further, while special power sources such as VDDQ and VSSQ dedicated to the output transistors are necessary additionally on the right side, they may be placed preferably.

For instance, as for the dimensions between the bonding pads PS and PD and the memory array regions UL, UR, DL and DR, when the interval T between the memory array regions UL and UR disposed on the upper side and the memory array regions DL and DR disposed on the lower side is around 700 μm, the center line of the bonding pads PS of the address and clock signal system on the left side is disposed so as to be spaced by a distance TL of around 230 μm from the center and the center line of the bonding pads PD of the data signal system is disposed so as to be spaced by a distance TR of around 200 μm from the center. No sense amplifier is included in the region of T, even though the main amplifier and the column decoder are included. The difference in shift between the bonding pads PS and the bonding pads PD is around 30 μm. The bonding pads PS and bonding pads PD include voltage pads such as VDD and VSS.

Figure 3:
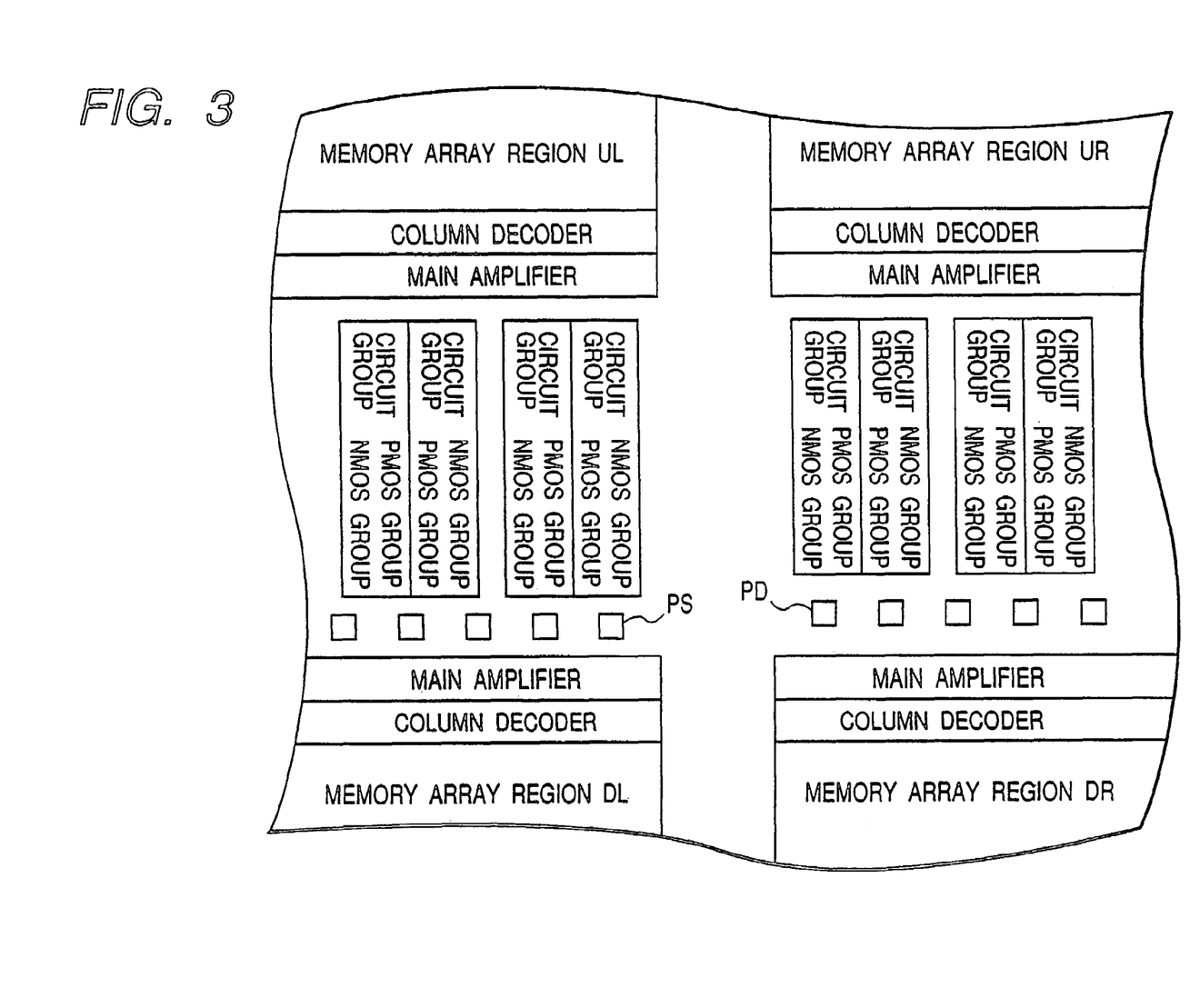
FIG. 3 is a schematic layout diagram showing the disposition of circuit blocks at the center part of a chip in the semiconductor memory device of the embodiment.

FIG. 3 is an enlarged view of the center part of the chip. A well separation may be omitted and the positive side power source line may be shared by placing two indirect peripheral circuit groups so that PMOS transistors adjoin each other back to back. When a metallic three-layer wiring structure is adopted, a metallic first layer is used for connecting elements within the cell, and the metallic second layer and the metallic third layer are used for coupling signals and power sources in the vertical (short edge) direction and the horizontal (long edge) direction, respectively, in the long edge region between the upper and lower memory array regions UL, UR, DL and DR. This is because the metallic three-layer wiring structure is thick and has the lowest resistance. Because the row decoder and main word driver regions between the memory array regions UL and UR and the memory array regions DL and DR are long in the vertical direction, the metallic three-layer wire is arranged in the vertical direction.

Figure 4:
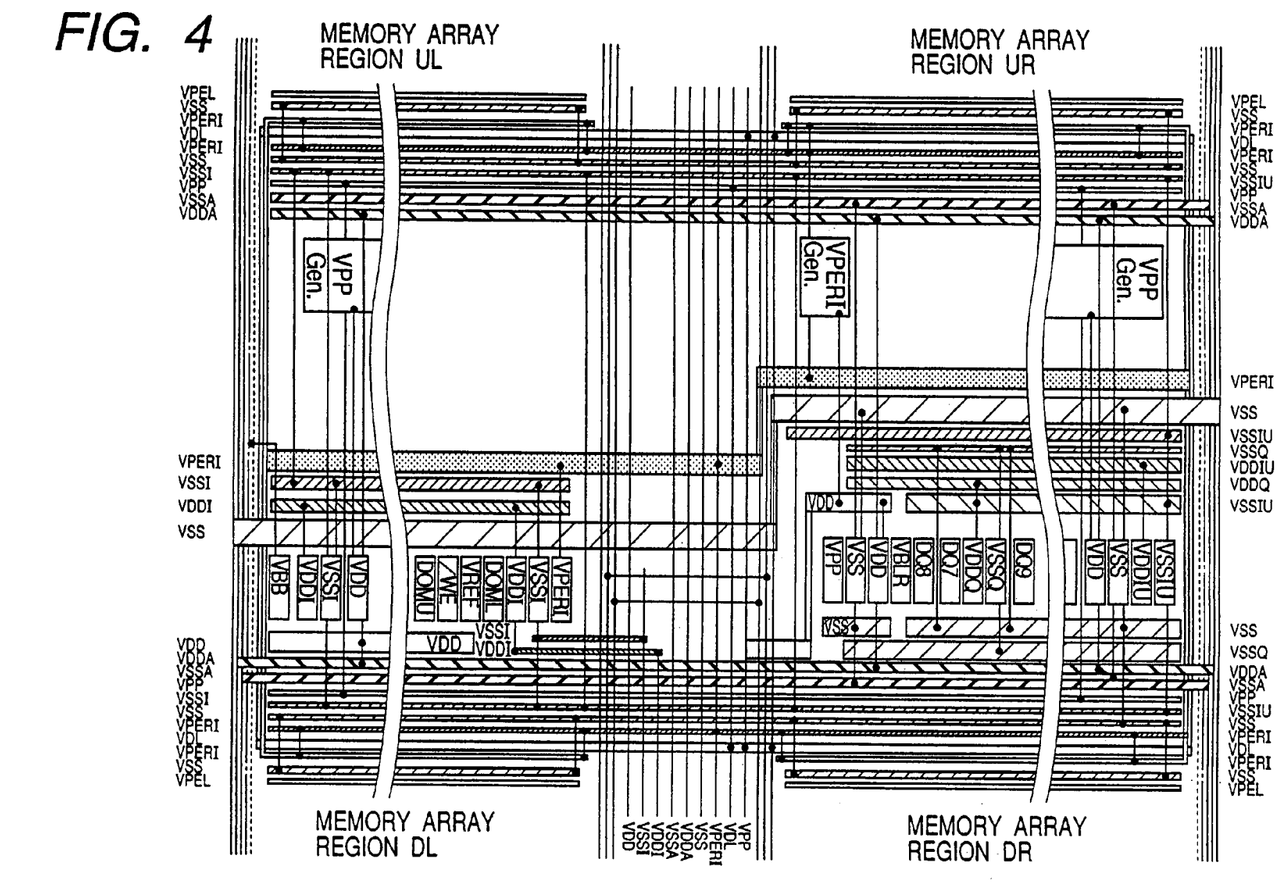
FIG. 4 is a schematic layout diagram showing the disposition of the bonding pads and power lines at the center part of the chip in the semiconductor memory device of the embodiment.

FIG. 4 shows the power source lines at the center part of the chip. A variety of power source lines are shown in the figure. VDDQ and VSSQ are the power sources dedicated to the output transistors, VSSI and VDDI are those for the input circuits, VDDA and VSSA are those for driving the sense amplifiers, VPERI is a step-down power source for the peripheral circuits, VDL is a power source for memory cell storage voltage and VPP is a power source for boosting the word line. Among these power source lines, the metallic two-layer and the metallic three-layer lines are arranged in the vertical and horizontal directions, respectively.

Figure 5:
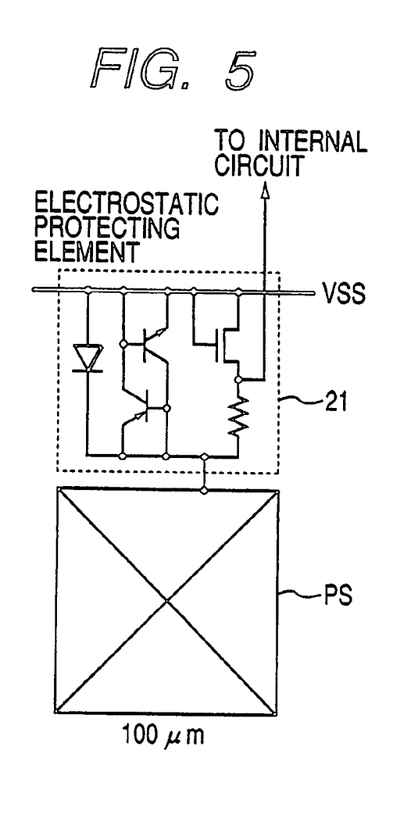
FIG. 5 is a schematic circuit diagram showing the surrounding area of the bonding pad for address and clock signals in the semiconductor memory device of the embodiment.

FIG. 5 shows the bonding pad PS for input signals. An electrostatic protecting element 21 is disposed on the bonding pad PS for the address and clock signals and the bonding pad PS is connected to an internal circuit via the electrostatic protecting element 21. The electrostatic protecting element 21 occupies a large area on one side of the bonding pad PS. A broken line in the figure indicates its approximate size.

Figure 6:
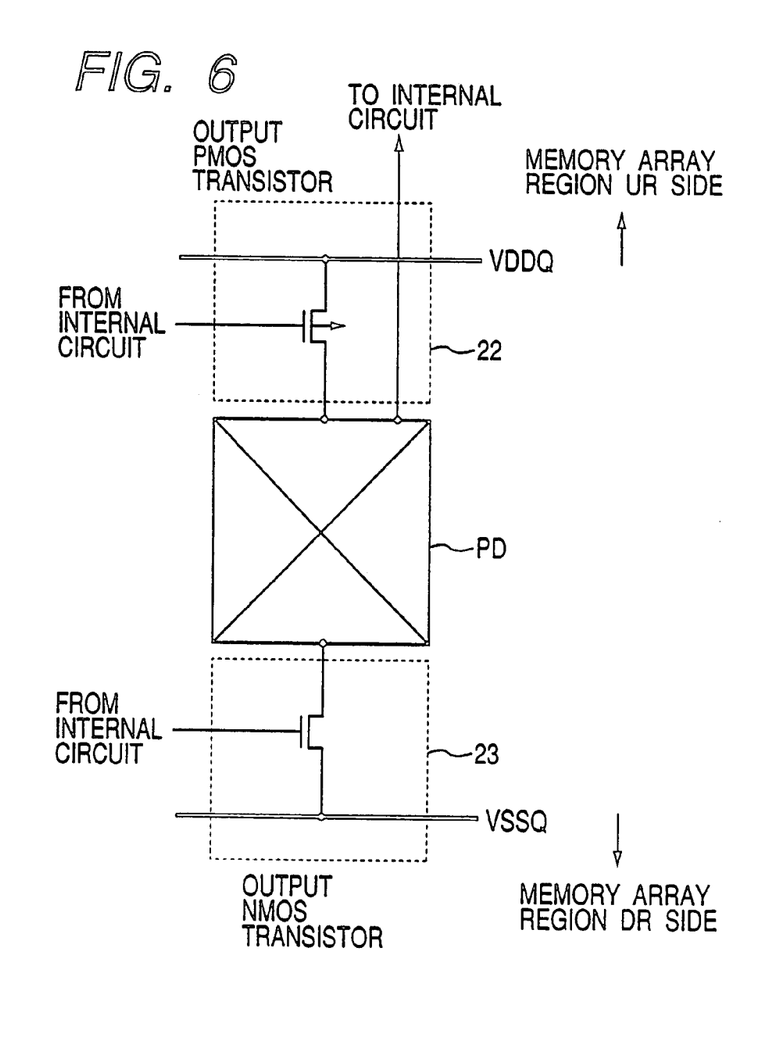
FIG. 6 is a schematic circuit diagram showing the surrounding area of the bonding pad for data signals in the semiconductor memory device of the embodiment.

FIG. 6 shows the bonding pad PD for data signals. An output PMOS transistor 22 and an output NMOS transistor 23 are disposed above and below the bonding pad PD. Gates of the output PMOS transistor 22 and the output NMOS transistor 23 are connected to the internal circuit. Broken lines in the figure indicate their approximate size. In contrast to the bonding pad PS for the input signals shown in FIG. 5, the bonding pad PD requires large areas thereabove and therebelow.

When the bonding pads are to be disposed efficiently by taking into account the differences in the sizes and the wiring characteristics of the elements around the bonding pad PS in FIG. 5 and the bonding pad PD in FIG. 6, it is desirable to stagger the position of the bonding pads PS and PD up and down on the right and left sides thereof as shown in FIGS. 2, 3 and 4. Thus, the bonding pads PS and PD on the right and left sides are located on the lower side, and the right bonding pads PD are disposed so as to be closer to the center more or less.

Figure 7:
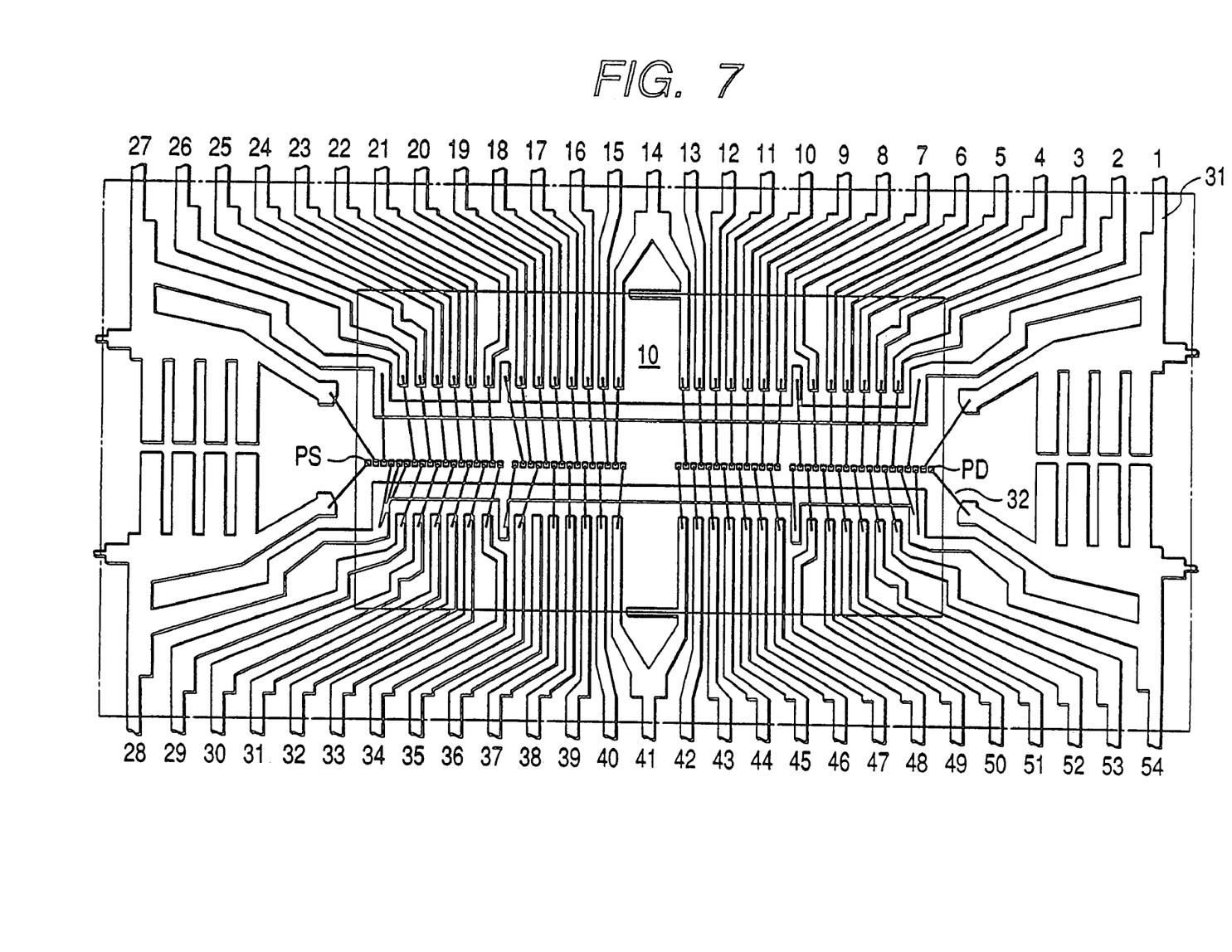
FIG. 7 is a schematic plan view showing an LOC bonding arrangement in the semiconductor memory device of the embodiment.

FIG. 7 is a plan view showing the state in which bonding has been implemented on an LOC (lead on chip) package. In the LOC package, a lead frame 31 is disposed above the memory chip 10 in the figure and the bonding pads PS and PD of the memory chip 10 are connected with the edge of the lead frame 31 by wire bonding using wires 32, such as gold lines. The bonding may be implemented on the LOC package in the same manner as the conventional method because the bonding pads PS and PD deviate less from the whole memory chip 10 even if they are shifted. FIG. 7 shows a package corresponding to the one shown in FIG. 8 in which the number of input/output pins is 54.

Therefore, according to the semiconductor memory device of the present embodiment, the indirect peripheral circuits are disposed collectively on the upper side by shifting the bonding pads PS and PD to the lower side as a whole, so that the number of signals exchanged between the upper and lower sides by using the gaps between the bonding pads PS and PD may be reduced. Further, only one set of power source buses is necessary for the indirect peripheral circuits. Still more, a large number of signal channels may be assured on the address and clock signal side by locating the right bonding pads PD closer to the upper side more or less. Although the data signal side requires not so many signal channels as compared to the address and clock signal side, the large output PMOS transistor 22 and the output NMOS transistor 23 may be suitably placed above and below the bonding pad PD while adjoining it. The special power sources such as VDDQ and VSSQ dedicated for the transistors 22 and 23 may be also suitably placed additionally. As a result, the indirect peripheral circuits may be efficiently laid out on the chip as a whole.

While the invention has been explained concretely based on an embodiment thereof, it is needless to say that the invention is not limited to the embodiment described above and may be variously modified within the scope of the invention.

For instance, although the case of disposing the bonding pads by shifting them to the lower side of center as a whole has been explained in the embodiment described above, the invention is not limited to such a case, since the bonding pads may be disposed by shifting them to the upper side of center. It is preferable to dispose the data signal side bonding pads so as to be closer to the center more or less also in this case.

Further, although the case of the four bank structure in which the memory array region is composed of the banks 0 through 3 has been shown, the invention is applicable also to a bank structure of eight banks for example. In such a case, the same effect may be obtained by disposing the bonding pads in the same manner as described above.

The effects obtained from typical aspects of the invention disclosed in the present application may be summarized as follows:

Because the indirect peripheral circuits may be disposed collectively on the other side by disposing the bonding pad groups not at the center, but as shifted to the upper or lower side between the memory array regions, the number of signals exchanged between the upper and lower sides by using the gaps of the bonding pads may be reduced;

(2) Only one set of power source buses necessary for the indirect peripheral circuits needs to be provided when disposing the indirect peripheral circuits collectively on the other side by the effect (1) described above;

(3) A large number of signal channels may be assured on the address and clock signal side by staggering the disposition of the bonding pads on the right and left sides and by disposing the data signal side bonding pads so as to be closer to the center more or less;

(4) The large output transistors may be placed above and below the bonding pad while adjoining it on the data signal side by disposing the data signal side bonding pads so as to be closer to the center by the effect (3) described above;

(5) The special power sources such as the power sources dedicated for the output transistors may be disposed additionally by disposing the data signal side bonding pads so as to be closer to the center by the effect (3) described above; and (6) Because the bonding pads and the indirect peripheral circuits may be efficiently laid out in the large capacity memory such as the DRAM and the SDRAM by the effects (1) through (5) described above, the speed may be improved by the reduction of the chip area and the reduction in length of the signal passages.

What is claimed:

1. A semiconductor memory device formed on a semiconductor substrate comprising:
   a plurality of first memory arrays formed in a first region, each of the plurality of first memory arrays having a plurality of first word lines, a plurality of first bit lines across the plurality of first word lines, and a plurality of memory cells arranged at predetermined intersections of the plurality of first word lines and the plurality of first bit lines;
   a plurality of second memory arrays formed in a second region, each of the plurality of second memory arrays having a plurality of second word lines, a plurality of second bit lines across the plurality of second word lines, and a plurality of second memory cells arranged at predetermined intersections of the plurality of second word lines and the plurality of second bit lines;
   a plurality of data input/output pads formed in a third region; and
   a plurality of output circuits coupled to the plurality of data input/output pads and formed in the third region,
   wherein the first region, the third region, and the second region are sequentially arranged in a first direction,
   wherein the plurality of data input/output pads are arranged between a center axis of the first direction of the semiconductor substrate and the first region,
   wherein no data input/output pads are arranged between the center axis of the first direction of the semiconductor substrate and the second region,
   wherein each of the plurality of output circuits has a first transistor whose source is coupled to a first voltage line and whose drain is coupled to a corresponding one of the plurality of data input/output pads and a second transistor whose source is coupled to a second voltage line and whose drain is coupled to the corresponding one of the plurality of data input/output pads,
   wherein the first transistors are arranged between the plurality of data input/output pads and the first region, and
   wherein the second transistors are arranged between the plurality of data input/output pads and the second region.

2. A semiconductor memory device according to claim 1, further comprising:
   a first circuit arranged between the center axis of the first direction of the semiconductor substrate and the second region;
   a third voltage line coupled to the first circuit;
   a first pad coupled to the first voltage line;
   a second pad coupled to the second voltage line; and
   a third pad coupled to the third voltage line;
   wherein the first voltage line is arranged between the first region and the plurality of data input/output pads, and
   wherein the second and third voltage lines are arranged between the second region and the plurality of data input/output pads.

3. A semiconductor memory device according to claim 1, further comprising:
   indirect peripheral circuits,
   wherein the indirect peripheral circuits are arranged between the second region and the plurality of data input/output pads.

4. A semiconductor memory device according to claim 1, further comprising:
   voltage generating circuits,
   wherein the voltage generating circuits are arranged between the second region and the plurality of data input/output pads, and
   wherein no voltage generating circuits are arranged between the first region and the plurality of data input/output pads.

5. A semiconductor memory device according to claim 1, further comprising:
   a plurality of address pads for inputting address signals,
   wherein the third region is divided into a fourth region and a fifth region by a center axis of a second direction of the semiconductor substrate, the second direction crossing the first direction,
   wherein the plurality of data input/output pads are arranged in the fourth region, and
   wherein the plurality of address pads are arranged at the fifth region.

6. A semiconductor memory device according to claim 5, wherein a distance between the plurality of address pads and the center axis of the first direction of the semiconductor substrate is shorter than a distance between the plurality of data input/output pads and the center axis of the first direction of the semiconductor substrate.

7. A semiconductor memory device according to claim 5, further comprising:
   a plurality of electrostatic protecting elements coupled to the plurality of address pads,
   wherein the plurality of electrostatic protecting elements are arranged between the plurality address pads and the second region.

8. A semiconductor memory device according to claim 1,
   wherein the first transistor is a NMOS transistor and the second transistor is a PMOS transistor, and
   wherein a voltage supplied to the first voltage line is smaller than a voltage supplied to the second voltage line.

9. A semiconductor memory device according to claim 1, wherein the semiconductor memory device is a DRAM.

10. A semiconductor memory device formed on a semiconductor substrate comprising:
    a first memory bank formed in a first rectangle region;
    a second memory bank formed in a second rectangle region;

a plurality of bonding pads formed in a third rectangle region; and a plurality of voltage generators formed in a fourth rectangle region, wherein the first rectangle region, the third rectangle region, the fourth rectangle region, and the second region are sequentially arranged in a first direction, wherein a distance between each of the plurality of bonding pads and the first region is shorter than a distance between each of the plurality of bonding pads and the second region, wherein the plurality of bonding pads include a plurality of data signal pads, wherein no data signal pads are formed in the fourth region, wherein the plurality of data signal pads are coupled to a plurality of output circuits, wherein each of the plurality of output circuits has a first transistor whose drain is coupled to a corresponding one of the plurality of data signal pads and a second transistor whose drain is coupled to the corresponding one of the plurality of data signal pads, wherein the first transistors are arranged, respectively, between the first region and a corresponding one of the plurality of data signal pads, wherein the second transistors are arranged, respectively, between the second region and a corresponding one of the plurality of data signal pads.

11. A semiconductor memory device according to claim 10, further comprising:

a first voltage line coupled to sources of the first transistors; and a second voltage line coupled to sources of the second transistors;

wherein the plurality of bonding pads further include a first pad coupled to the first voltage line and a second pad coupled to the second voltage line, wherein each of the first transistors is a NMOS transistor and each of the second transistor is a PMOS transistor, wherein the first voltage line is arranged between the plurality of data signal pads and the first region, and wherein the second voltage line is arranged between the plurality of data signal pads and the second region.

12. A semiconductor memory device according to claim 11, wherein the first and second pads are arranged between the plurality of data signal pads.

13. A semiconductor memory device according to claim 11, further comprising:

a third voltage line coupled to the plurality of voltage generators, wherein the plurality of bonding pads further include a third pad coupled to the third voltage line, and wherein the third voltage line is arranged between the plurality of data signal pads and the second region.

14. A semiconductor memory device according to claim 11, wherein the plurality of bonding pads further include a plurality of address pads, wherein the third region is divided into a fifth region and a sixth region by a center axis of a second direction of the semiconductor substrate, the second direction crossing the first direction, wherein the plurality of the data signal pads is formed in the fifth region, and wherein the plurality of the address pads is formed in the sixth region.

15. A semiconductor memory device according to claim 14 further comprising:

a plurality of electrostatic protection elements coupled to the plurality of address pads, wherein the plurality of electrostatic protection elements are formed between the plurality of address pads and the second region.

16. A semiconductor memory device according to claim 14, wherein a distance between the first region and each of the plurality of address pads is shorter than a distance between the first region and each of the plurality of data signal pads.

17. A semiconductor memory device according to claim 10, wherein no bonding pads are formed in the first region.

18. A semiconductor memory device according to claim 10, wherein the semiconductor memory device is a DRAM.

* * * * *